United States Patent
Kline et al.

(10) Patent No.: US 9,338,885 B2
(45) Date of Patent: May 10, 2016

(54) BALL GRID ARRAY REWORK

(71) Applicant: International Business Machines Corporation, Armonk, NY (US)

(72) Inventors: Eric V. Kline, Rochester, MN (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 14/324,647

(22) Filed: Jul. 7, 2014

(65) Prior Publication Data

US 2016/0007457 A1    Jan. 7, 2016

(51) Int. Cl.
| | |
|---|---|
| H01L 23/48 | (2006.01) |
| H01L 23/52 | (2006.01) |
| H01L 29/40 | (2006.01) |
| H05K 1/11 | (2006.01) |
| H05K 13/04 | (2006.01) |
| B23K 1/018 | (2006.01) |

(52) U.S. Cl.
CPC ........ H05K 1/11 (2013.01); B23K 1/018 (2013.01); H05K 13/0486 (2013.01)

(58) Field of Classification Search
CPC ....... H05K 13/0486; H05K 1/11; B23K 1/018
USPC ................... 257/738, 778; 174/261; 228/264
See application file for complete search history.

(56) References Cited

U.S. PATENT DOCUMENTS

| | | | |
|---|---|---|---|
| 5,371,328 A | 12/1994 | Gutierrez et al. | |
| 5,581,441 A | 12/1996 | Porter | |
| 5,633,535 A * | 5/1997 | Chao | H01L 24/75 257/738 |
| 6,216,937 B1 | 4/2001 | DeLaurentis et al. | |
| 6,360,938 B2 | 3/2002 | DeLaurentis et al. | |
| 6,773,535 B1 | 8/2004 | Wetzel | |
| 7,234,218 B2 | 6/2007 | Farooq et al. | |
| 7,371,673 B2 * | 5/2008 | Matsunami | H01L 21/4846 257/730 |
| 7,474,540 B1 | 1/2009 | Dang et al. | |
| 2013/0141345 A1 | 6/2013 | Wang | |

FOREIGN PATENT DOCUMENTS

| | | |
|---|---|---|
| JP | 60062130 | 4/1985 |
| JP | 63155752 | 6/1988 |

\* cited by examiner

*Primary Examiner* — Thien F Tran
(74) *Attorney, Agent, or Firm* — Lieberman & Brandsdorfer, LLC

(57) ABSTRACT

Embodiments of the invention relates to a method and apparatus for rework of a BGA package. Memory shape material is placed adjacent to a plurality of solder joints of the package. Stimulation is applied to the material, with the stimulation causing the material to change from a non-stimulated shape to a stimulated shape. This stimulation causes an expansion of the material. As the material expands, it exerts a tensile force on the BGA package and an adjacently positioned carrier, causing a separation of the two components, while mitigating collateral heat of adjacently positioned components.

5 Claims, 5 Drawing Sheets

BALL GRID ARRAY REWORK

BACKGROUND

The present invention relates to rework for a ball grid array package, including removal of the ball grid array package from an associated printed circuit board or carrier. More specifically, the invention relates to an expansion material and control of the material in a manner that applies an expansion force to adjacently positioned solder joints.

Computer systems are generally configured with a memory module(s) and integrated circuits in communication with a printed circuit board (PCB). A ball grid array package (BGA) is a type of surface-mount packaging used for integrated circuits. BGA packages are used to permanently mount devices such as microprocessors. The BGA package uses a grid of solder balls as its connectors to a printed circuit board (PCB) or carrier. Rework pertains to repair or refinishing a PCB assembly. The aspect of rework generally includes uncoupling the package or other electronic components from the substrate, and in one embodiment re-soldering components to the substrate.

BRIEF SUMMARY

The invention comprises an apparatus for a rework process that employs localized heating for expanding solder joints between the BGA and the PCB.

A BGA package is assembled on to a printed circuit board with an expansion material. Configuration of the package includes interstitial placement of the material within a matrix of solder joints. A tensile force is applied between a ball grid array (BGA) package and the printed circuit board through delivery of electrical current to the material. In one embodiment, the application of the force is controlled. The current creates a localized heating of the expansion material, and the heated material applies an expansion force to the solder joints. This expansion force separates the BGA from the printed circuit board.

Other features and advantages of this invention will become apparent from the following detailed description of the presently preferred embodiment(s) of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

An apparatus and method for a rework process creating localized stimulation for localized heating and expansion of solder joints between a BGA and a PCB or an alternate substrate is described in detail below. The apparatus and method employs an expansion material in communication with the BGA package and the PCB. More specifically, the expansion material is interstitially placed within a matrix of BGA solder joints. The material is comprised of a memory shape alloy, or in one embodiment, a high z-axis coefficient of thermal expansion material. When subject to stimulation, such as heating, the material expands, and this expansion applies an expansion force to both the PCB and the BGA package. In one embodiment, the heated material has an exothermic reaction, and the heat softens the adjacently positioned solder joints. Accordingly, application of heat to the material both expands and softens the solder joints, thereby facilitating separation of the BGA from the PCB.

Figure 1:
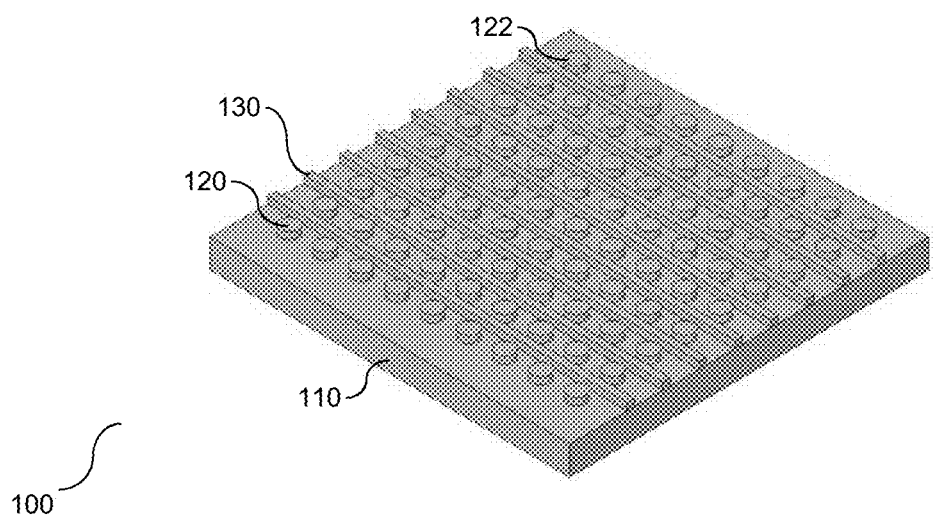
FIG. 1 depicts a perspective view of a ball grid array package with an expansion material.

Referring now to FIG. 1, a perspective view (100) of a ball grid array package (rendered transparent) is shown assembled on to a PCB or substrate with an expansion material situated interstitially between the solder joints. As shown, the BGA package is shown with a substrate (110) and a matrix of solder balls (120). An expansion material (130) is placed within the matrix (120). In one embodiment, the matrix (120) includes a plurality of rows and columns. The material (130) is shown placed in each adjacently positioned row in the matrix (120). In one embodiment, the material (130) may be placed in alternative rows of the matrix, and should not be limited to adjacently positioned rows. The material (130) is comprised of a height and width that enables it to be received within the matrix. In one embodiment, the width of the material is limited to the width between adjacently positioned solder balls. Similarly, in one embodiment, the height of the material is limited to the height of the solder balls from the base of the substrate (110) to the top surface of the solder ball (122). The BGA package may be pre-configured with the material within the matrix of solder joints, or in one embodiment, the material may be threaded or otherwise placed adjacent to the solder joints. Accordingly, the configuration of the material is limited by the configuration of the matrix, and specifically by the dimensions and positioning of the solder balls that comprise the matrix.

Figure 2:
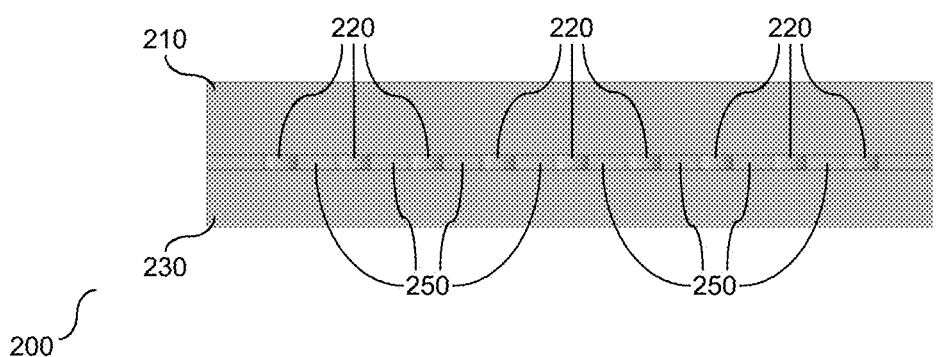
FIG. 2 depicts a cross sectional view of the BGA package in communication with a PCB prior to application of a stimulus.

The BGA package shown in FIG. 1 is an illustration of the transparent ball grid array package assembled on to the PCB or substrate. Referring to FIG. 2, a cross sectional view (200) of the BGA package in communication with a PCB prior to application of force. As shown, the BGA package (210) is in communication with the PCB (230) through an array of solder balls (220). A gap (250), also referred to herein as a first gap, represents the spacing between the BGA package (210) and the PCB (230) formed by the connection of the PCB (230) and the BGA package (210) via one or more solder joints (220), also referred to herein as a solder ball connection. Specifically, the solder joints (220) hold the PCB (230) and BGA (210) in a fixed relationship. In one embodiment, the connection formed by the solder balls is referred to as a solder joint. Expansion material (not shown) is positioned between adjacently positioned solder joints. Specifically, the expansion material is arranged in parallel on both sides of the solder joint in the gap (250). Accordingly, the expansion material occupies vacant space formed between adjacently positioned solder joints.

Figure 3:
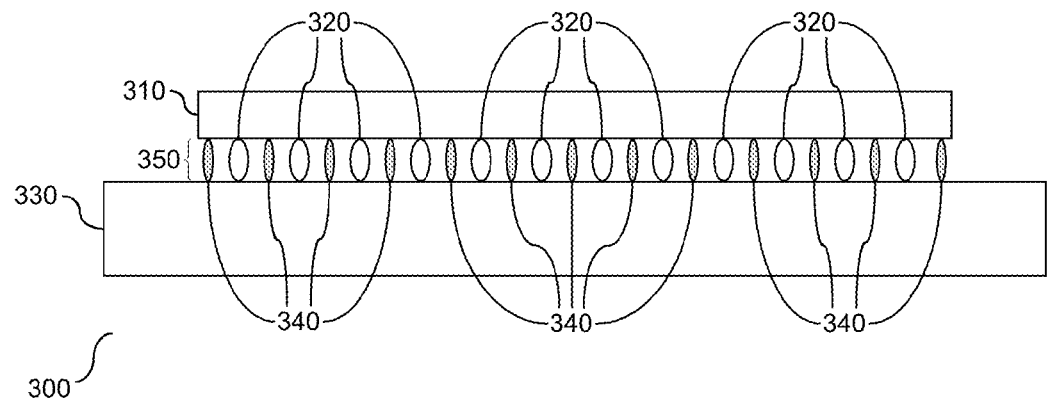
FIG. 3 depicts a cross sectional view illustrating expansion of the solder joints following application of a stimulus to the associated expansion material.

The expansion material shown in FIGS. 1 and 2, represents the material at a rest state prior to expansion of the material and/or expansion of the adjacently positioned solder joints. The material is configured to change shape in response to a stimulus. Referring to FIG. 3, a cross sectional view (300) is provided illustrating expansion of the solder joints following application of a stimulus to the associated expansion material. As shown, the BGA package (310) is in communication with the PCB (330) through an array of solder balls (320). A gap (350), also referred to herein as a second gap, represents the spacing between the BGA package (310) and the PCB (330) formed by the connection of the PCB (330) and the BGA package (310) via one or more solder joints (320), also referred to herein as a solder ball connection. Expansion material (340) is shown between adjacently positioned solder joints. Specifically, the expansion material (340) is arranged in parallel on both sides of the solder joint. As shown herein, the expansion material (340) has an expanded form and elongated shape following receipt of a stimulus and in comparison to the material (240) shown in FIG. 2 prior to receipt of a stimulus. In addition, the second gap (350) is shown larger than the first gap (250), as a result of the change in size and shape of the expansion material (140). As shown, the size and shape of the expansion material (340) changes and elongates in response to the stimulus. In one embodiment, the size and shape of the solder joints (320) also changes in response to the changes experienced by the material (340). As shown herein, in one embodiment, the solder joints (320) elongate in conjunction with, or in response to, the elongation of the material (340). Accordingly, application of stimulus to the expansion material (340) increases the size of the second gap (350) representing the space between the BGA package (310) and the PCB (330).

Figure 4:
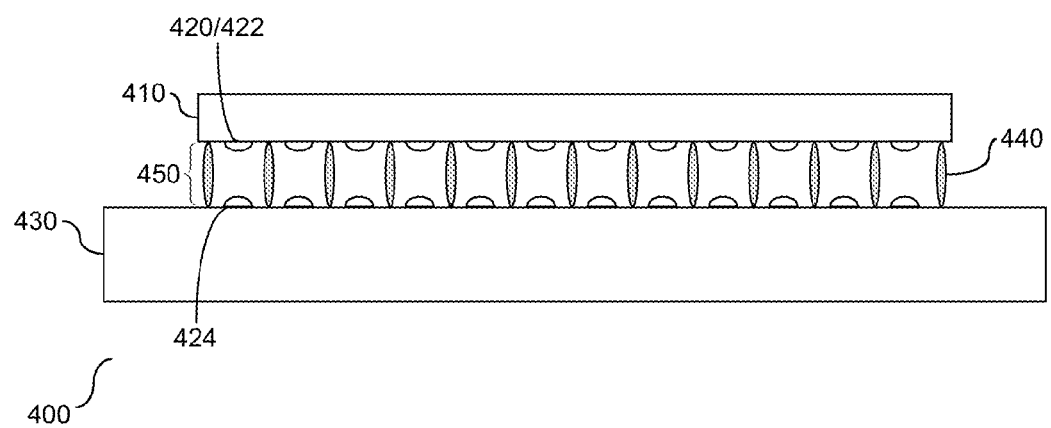
FIG. 4 depicts a cross sectional view illustrating further expansion of the material following application of the stimulus.

The focus of the expansion material is to facilitate rework of the BGA package. Rework may be required for a plurality of reasons, including replacement, upgrade, etc., of a component. In FIG. 3, the expansion of the material in conjunction with expansion of the solder joints is shown. Referring to FIG. 4, a cross sectional view (400) is provided illustrating further expansion of the material following application of the stimulus. The BGA package (410) is shown with limited communication with the PCB (430). More specifically, a gap (450) represents spacing between the BGA package (410) and the PCB (430). The gap (450) is also referred to herein as a third gap. Responsive to the expansion of the material (440), the solder joints (420) are severed. As shown, a first portion of the solder joint (422) is in communication with the BGA package (410) and a second portion of the solder joint (424) is in communication with the PCB (430). In one embodiment, the deformed solder joints remain in communication with the PCB (430) and are removed from the BGA package (410). The severing of the solder joint (420) is in response to expansion of the material (440). In one embodiment, the material (440) remains contiguous, while the solder joints are sheared. The expansion of the material (440) applies a high out of plane force on the PCB (430) and on the bottom of the package (410). Accordingly, a resulting effect of the material expansion severs the solder joints.

Figure 5:
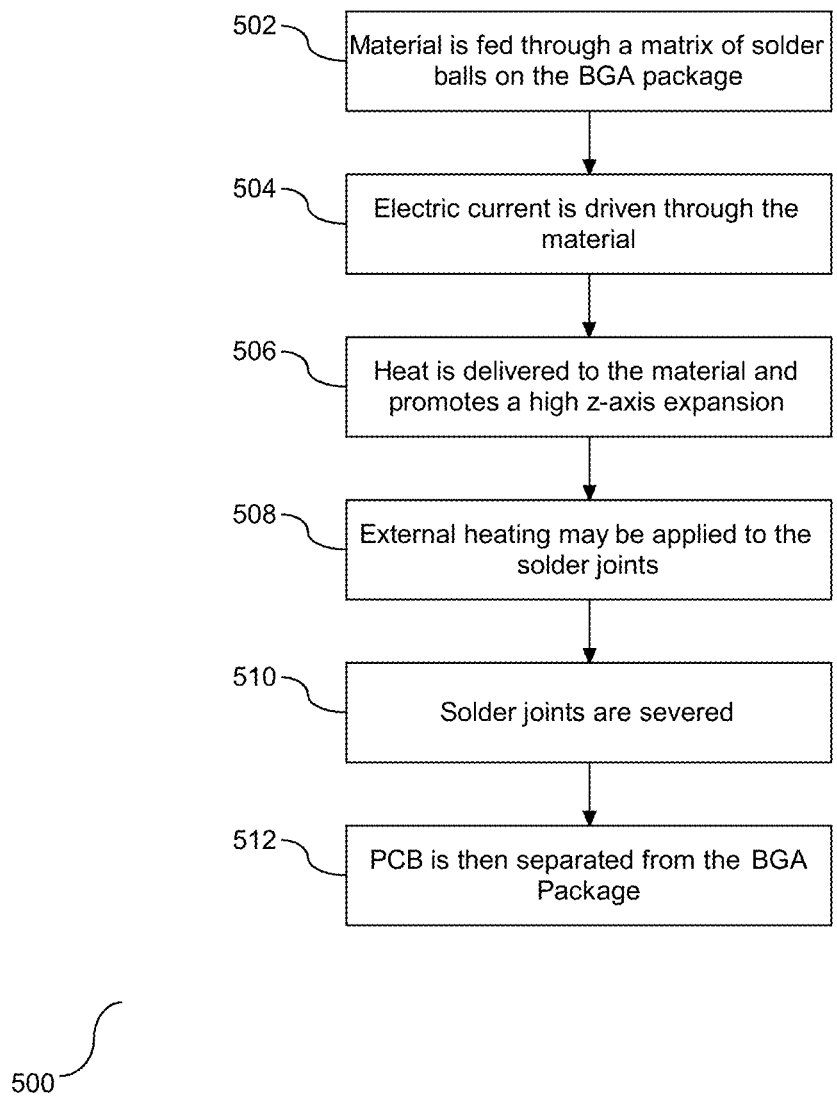
FIG. 5 depicts a flow chart illustrating a process for decoupling an assembled BGA package and the PCB.

Referring to FIG. 5, a flow chart (500) is provided illustrating a process decoupling the BGA package and the PCB. As shown, a material is fed through a matrix of solder balls on the BGA package (502). In one embodiment, the matrix includes a plurality of rows and columns, and the material is arranged in parallel across the rows or across the columns. Similarly, in one embodiment, the material is placed in each adjacently positioned row or column, or in another embodiment, the material is placed in selected rows or columns within the matrix. In one embodiment, the material placed in the matrix includes a memory shape alloy. Following the material placement, an electric current is driven through the material (504). The current delivers heat to the material and promotes a high z-axis expansion of the material (506). In one embodiment, the material has an original expanded shape and is placed in the matrix in a reduced shape. When subject to heating or in receipt of electrical current, the material transforms from the reduced shape to the original expanded shape. In one embodiment, delivery of electricity, referred to herein as a compression mode, is controllable with the amount of electricity proportional to the expansion of the material. Similarly, in one embodiment, external heating may be applied to the solder joints (508). In one embodiment, the external heating is delivered from a hot air rework nozzle. Similarly, in one embodiment, the material receives electrical current concurrent with the external heating directed to the solder joints. Delivery of the current and the heat may be concurrent or sequential. The expansion force from the material severs the solder joints (510), and the PCB is then separated from the BGA package (512). Accordingly, delivery of current to the material transforms the material into an expanded shape, forcing the PCB and the BGA package to separate.

As shown in FIGS. 1-5, displacement growth between the BGA package and the PCB, also referred to as the carrier, is driven by expansion of the material and solder joint deformation due to displacement. In one embodiment, neither the displacement nor the solder joint deformation is uniform. However, the memory shape alloy material supports direct heat delivery to a specified location and mitigates collateral heat of adjacently positioned components. Accordingly, the heat delivery is direct and specific.

As shown and described herein, the memory shaped alloy material is placed within the matrix of the solder joints in a reduced form. When subject to heat, the material transform into an expanded shape. Expansion of the material is limited with respect to the configuration of the carrier. In one embodiment, the maximum z-axis expansion is 42.5 microns. To ensure expansion in the direction of the solder joint, the separation force may be tuned through use of anisotropic expansion materials. In one embodiment, the anisotropic expansion materials may be in a rectangular form with an elongated axis, such as a ribbon structure. Accordingly, selection of materials may be employed with respect to the structure of the carrier and/or the desired expansion for rework.

The rework illustrated and described herein is with respect to a BGA package and a carrier. In one embodiment, the expansion material may be used to separate one or more die in a multi-die stacked package. The memory shape alloy material enables the separation while mitigating collateral reflow from any adjacently positioned components. Accordingly, the application of the memory shape alloy material may be expanded to various configurations within a carrier and associated packages and die.

Figure 6:
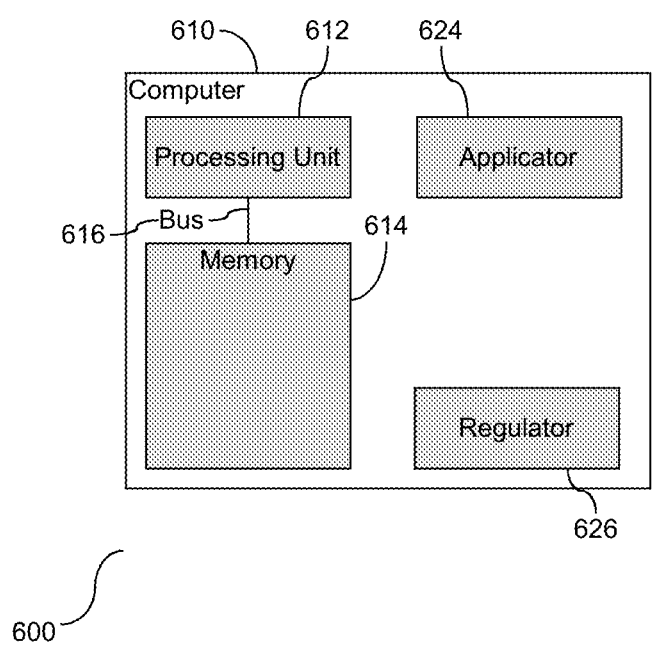
FIG. 6 depicts a block diagram of a system with a computer in communication with PCB.

The BGA rework may be automated through a series of tools and associated computer readable and executable instructions. Referring to FIG. 6, a system is provided with a computer in communication with PCB. The computer (610) is provided with a processing unit (612) operably coupled to memory (614) across a bus (616). One or more tools are shown to facilitate expansion of the memory shaped alloy material placed adjacent to the solder joints of the BGA package. The tools include an applicator (624) to deliver the electrical current to the material, and a regulator (626) to control the level of current being delivered. In one embodiment, one or more computer readable instructions are processed to control the delivery of current to the material. Similarly, in one embodiment, the level of current delivered to the material is directly or indirectly proportional to the tensile force between the BGA package and the PCB, and by controlling the current, the regulator (626) controls the application of force. Rework may be directed to a specific BGA package, a multi-stack die, or in one embodiment, a combination of two or more packages or die. The applicator (624) and regulator (626) are employed to direct the rework to a designated location and associated material.

The tools shown in FIG. 6 may be implemented in programmable hardware devices such as field programmable gate arrays, programmable array logic, programmable logic devices, or the like. The tool may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of the tool need not be physically located together, but may comprise disparate instructions stored in different locations which, when joined logically together, comprise the tool and achieve the stated purpose of the tool.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single data set, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Figure 7:
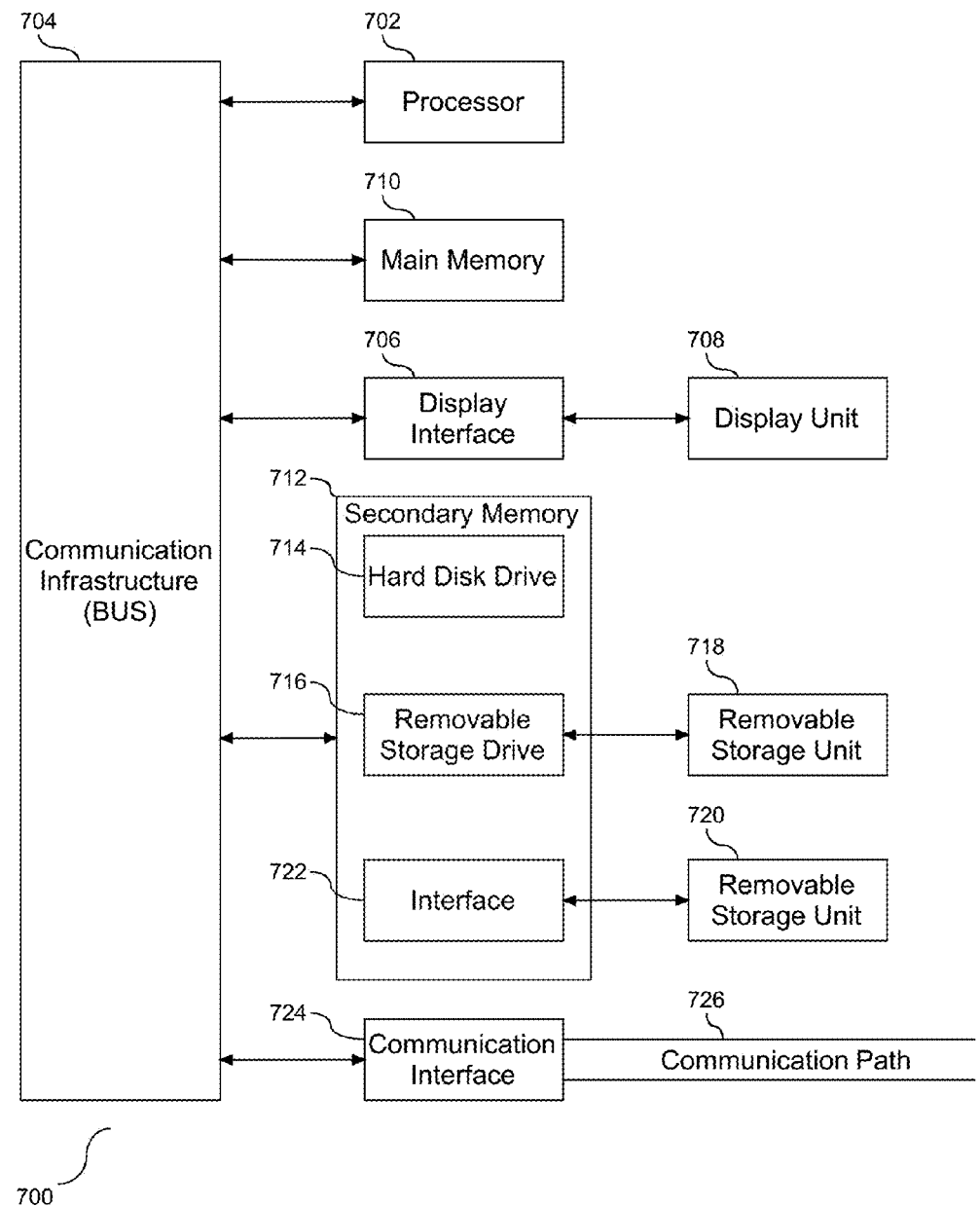
FIG. 7 depicts a block diagram of a computing environment according to an embodiment of the present invention.

Referring now to the block diagram of FIG. 7, additional details are now described with respect to implementing an embodiment of the present invention. The computer system includes one or more processors, such as a processor (702). The processor (702) is connected to a communication infrastructure (704) (e.g., a communications bus, cross-over bar, or network).

The computer system can include a display interface (706) that forwards graphics, text, and other data from the communication infrastructure (704) (or from a frame buffer not shown) for display on a display unit (708). The computer system also includes a main memory (710), preferably random access memory (RAM), and may also include a secondary memory (712). The secondary memory (712) may include, for example, a hard disk drive (714) and/or a removable storage drive (716), representing, for example, a floppy disk drive, a magnetic tape drive, or an optical disk drive. The removable storage drive (716) reads from and/or writes to a removable storage unit (718) in a manner well known to those having ordinary skill in the art. Removable storage unit (718) represents, for example, a floppy disk, a compact disc, a magnetic tape, or an optical disk, etc., which is read by and written to by removable storage drive (716). As will be appreciated, the removable storage unit (718) includes a computer readable medium having stored therein computer software and/or data.

In alternative embodiments, the secondary memory (712) may include other similar means for allowing computer programs or other instructions to be loaded into the computer system. Such means may include, for example, a removable storage unit (720) and an interface (722). Examples of such means may include a program package and package interface (such as that found in video game devices), a removable memory chip (such as an EPROM, or PROM) and associated socket, and other removable storage units (720) and interfaces (722) which allow software and data to be transferred from the removable storage unit (720) to the computer system.

The computer system may also include a communications interface (724). Communications interface (724) allows software and data to be transferred between the computer system and external devices. Examples of communications interface (724) may include a modem, a network interface (such as an Ethernet card), a communications port, or a PCMCIA slot and card, etc. Software and data transferred via communications interface (724) is in the form of signals which may be, for example, electronic, electromagnetic, optical, or other signals capable of being received by communications interface (724). These signals are provided to communications interface (724) via a communications path (i.e., channel) (726). This communications path (726) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (710) and secondary memory (712), removable storage drive (716), and a hard disk installed in hard disk drive (714).

Computer programs (also called computer control logic) are stored in main memory (710) and/or secondary memory (712). Computer programs may also be received via a communication interface (724). Such computer programs, when run, enable the computer system to perform the features of the present invention as discussed herein. In particular, the computer programs, when run, enable the processor (702) to perform the features of the computer system. Accordingly, such computer programs represent controllers of the computer system.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider.

Aspects of the present invention are described above with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the functions/acts specified in the flowcharts and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Employment of the memory shaped material for the rework supports direct application of the rework to a specific component. Accordingly, the placement and arrangement of the shape changing material enables and supports rework to a direct location, while mitigating collateral heat to adjacently positioned components.

ALTERNATIVE EMBODIMENT

It will be appreciated that, although specific embodiments of the invention have been described herein for purposes of illustration, various modifications may be made without departing from the spirit and scope of the invention. In one embodiment, the expansion material may be in the form of a wire that is fed through the matrix of solder balls. The material is shown to be placed in a parallel or relatively parallel arrangement within the matrix. In one embodiment, the material may be placed in the matrix in a non-parallel arrangement. Accordingly, the scope of protection of this invention is limited only by the following claims and their equivalents.

We claim:

1. An apparatus comprising:
    a ball grid array (BGA) package assembled on to a printed circuit board;
    an expansion material placed between the BGA package and the printed circuit board, including interstitial placement of the material within a matrix of solder joints between the BGA package and the printed circuit board;
    an applicator in communication with the material, the applicator to apply a tensile force between a ball grid array (BGA) package and the printed circuit board, including delivery of electric current to the expansion material, wherein the application of the tensile force is controlled by a regulator in communication with the applicator;
    a localized heating of the expansion material created from the current;
    an expansion force applied to the solder joints from the heated material, the expansion force including separation of the BGA from the printed circuit board.

2. The apparatus of claim 1, further comprising the expansion force to elongate the solder joints into two parts, including a first part to remain in communication with the BGA package and a second part to remain in communication with the printed circuit board.

3. The apparatus of claim 1, wherein the expansion material is selected from the group consisting of: a memory shape alloy and a high z-axis coefficient of thermal expansion material.

4. The apparatus of claim 1, further comprising an alignment of the material in parallel across the matrix, including parallel placement of the material positioned between BGA package solder joints.

5. The apparatus of claim 1, further comprising the application to deliver heat from an external source to the solder joints concurrent with delivery of the electric current to the material.

* * * * *